United States Patent
Gong et al.

(10) Patent No.: US 12,232,250 B2
(45) Date of Patent: Feb. 18, 2025

(54) STIFFENER RING AND SURFACE PACKAGING ASSEMBLY

(71) Applicant: HUAWEI TECHNOLOGIES CO., LTD., Guangdong (CN)

(72) Inventors: Chuncheng Gong, Shenzhen (CN); Li Fan, Dongguan (CN); Weijin Pan, Dongguan (CN); Junwei Mu, Dongguan (CN); Ge Zhang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 225 days.

(21) Appl. No.: 17/974,619

(22) Filed: Oct. 27, 2022

(65) Prior Publication Data

US 2023/0066053 A1 Mar. 2, 2023

Related U.S. Application Data

(63) Continuation of application No. PCT/CN2021/090585, filed on Apr. 28, 2021.

(30) Foreign Application Priority Data

Apr. 28, 2020 (CN) .......................... 202010348428.0
Apr. 23, 2021 (CN) .......................... 202110439387.0

(51) Int. Cl.
*H01L 23/00* (2006.01)
*H01L 23/32* (2006.01)
(Continued)

(52) U.S. Cl.
CPC ........... *H05K 1/0271* (2013.01); *H01L 23/32* (2013.01); *H01L 23/562* (2013.01); *H05K 1/181* (2013.01);
(Continued)

(58) Field of Classification Search
CPC .................................................... H01L 23/562
See application file for complete search history.

(56) References Cited

U.S. PATENT DOCUMENTS

| | | | |
|---|---|---|---|
| 8,675,656 B2 | 3/2014 | Guichard et al. | |
| 2004/0150101 A1* | 8/2004 | Fraley | H01L 25/18 |
| | | | 257/E23.173 |

(Continued)

FOREIGN PATENT DOCUMENTS

| CN | 101197335 A | 6/2008 |
|---|---|---|
| CN | 103000591 A | 3/2013 |
| CN | 107210282 A | 9/2017 |

OTHER PUBLICATIONS

He Yan et al., "BGPmon: A real-time, scalable, extensible monitoring system", Cyersecurity Applications and Technology Conference For Homeland Security, 2009 IEEE, total: 12 pages.
(Continued)

*Primary Examiner* — Hung V Ngo

(57) ABSTRACT

This application provides a stiffener ring and a surface packaging assembly. The stiffener ring is configured to correct warpage of a substrate of the surface packaging assembly. The stiffener ring includes an annular stiffener ring body and an adjustment block that is disposed at a same layer as the stiffener ring body and that is fastened to at least one corner of the stiffener ring body. A coefficient of thermal expansion of the adjustment block is less than a coefficient of thermal expansion of the stiffener ring body. Coordination between the adjustment block and the stiffener ring body alleviates an "M-shape" overpressure phenomenon of a warpage deformation caused by the stiffener ring to the substrate at a high temperature, reduces warpage of the substrate, and improves flatness of the surface packaging assembly.

19 Claims, 8 Drawing Sheets

(51) Int. Cl.
*H05K 1/02* (2006.01)
*H05K 1/18* (2006.01)

(52) U.S. Cl.
CPC .............. *H05K 2201/09136* (2013.01); *H05K 2201/10424* (2013.01)

(56) References Cited

U.S. PATENT DOCUMENTS

| | | | | |
|---|---|---|---|---|
| 2005/0127502 | A1* | 6/2005 | Lee | H01L 23/36 |
| | | | | 257/E23.101 |
| 2005/0161816 | A1 | 7/2005 | Kanda | |
| 2005/0199998 | A1* | 9/2005 | Chen | H01L 23/16 |
| | | | | 257/706 |
| 2006/0261469 | A1* | 11/2006 | Ni | H01L 24/29 |
| | | | | 257/E23.09 |
| 2007/0278647 | A1* | 12/2007 | Morita | H01L 23/16 |
| | | | | 257/686 |
| 2009/0001528 | A1* | 1/2009 | Braunisch | H01L 23/647 |
| | | | | 257/E23.101 |
| 2011/0156235 | A1* | 6/2011 | Yuan | H01L 23/49833 |
| | | | | 257/E21.511 |
| 2013/0062752 | A1* | 3/2013 | Lin | H01L 23/36 |
| | | | | 257/729 |
| 2014/0183752 | A1* | 7/2014 | Lin | H01L 23/16 |
| | | | | 438/126 |
| 2014/0291001 | A1* | 10/2014 | Lin | H01L 23/49833 |
| | | | | 29/852 |
| 2016/0139068 | A1* | 5/2016 | Han | G01N 25/16 |
| | | | | 702/136 |
| 2016/0172229 | A1* | 6/2016 | Brun | H01L 21/78 |
| | | | | 438/464 |

OTHER PUBLICATIONS

PCT International Search Report for Application No. PCT/CN2021/090585 dated Apr. 23, 2021, 48 pages.
Extended European Search Report for Application No. 21849711.3 dated Sep. 13, 2023, 10 pages.
Extended European Search Report for Application No. 21797558.0 dated Sep. 14, 2023, 17 pages.

* cited by examiner

STIFFENER RING AND SURFACE PACKAGING ASSEMBLY

CROSS-REFERENCE TO RELATED APPLICATIONS

This application is a continuation of International Application No. PCT/CN2021/090585, filed on Apr. 28, 2021, which claims priority to Chinese Patent Application No. 202010348428.0, filed on Apr. 28, 2020 and Chinese Patent Application No. 202110439387.0, filed on Apr. 23, 2021. The disclosures of the aforementioned applications are hereby incorporated by reference in their entireties.

TECHNICAL FIELD

This application relates to the field of surface packaging assembly technologies, and in particular, to a stiffener ring and a surface packaging assembly.

BACKGROUND

Ball grid array (BGA) packaging is a packaging technology used for integrated circuits. Pins are ball-shaped and are arranged in a grid pattern to fully cover (or partially cover) the bottom of a packaging substrate. When a chip works, an electrical signal is transmitted from an integrated circuit of the chip to a printed circuit board (PCB) by using pins, and the pins are generally tin alloy solder balls. A BGA package is mounted to the PCB board through a surface mount technology process, and a solder ball at the bottom of the substrate is correspondingly connected to a copper foil on the PCB board.

A flip chip ball grid array (FC-BGA) is a type of BGA package and is widely used in high-performance chips such as a digital signal processor (DSP), a graphics processing unit (GPU), and an application-specific integrated circuit (ASIC). FIG. 2 is a sectional view of a structure of the flip chip ball grid array. An active layer of the chip is mounted upside down on the packaging substrate and is connected to contact pads on the substrate by using solder bumps. An underfill material exists between the chip and the substrate to reduce a difference between coefficients of thermal expansion of the chip and the substrate. A stiffener ring is bonded to the substrate by using an adhesive, and further provides mechanical support for a heat sink in some packaging structures.

In the surface mount technology process, reflow soldering is the most commonly used method for mounting an FC-BGA chip to a surface of a PCB board. Gradual heating is used in reflow soldering to make a solder ball and solder paste reflow in a molten state to form a permanent solder joint, so that a circuit connection between the chip/the packaging substrate and the PCB board is implemented. A peak temperature of reflow soldering is determined by a melting point of a selected tin alloy solder ball. However, in an FC-BGA package, coefficients of thermal expansion of different materials are different, and a warpage deformation occurs on the substrate in a high-temperature reflow soldering process, leading to failures such as bridging and a head-in-pillow effect of the solder ball after reflowing. (In most cases, a zero-warpage temperature of an FC-BGA package body is a temperature T between 100° C. and 200° C. At this temperature, the package body is horizontal, and a warpage value is close to 0. When a temperature is greater than this temperature, "smiling face" warpage occurs on the FC-BGA package body, and when a temperature is less than this temperature, "crying face" warpage occurs on the FC-BGA package body. In rare cases, a zero-stress temperature may be less than a room temperature or greater than the peak temperature of reflow soldering, and "smiling face" or "crying face" warpage occurs on the FC-BGA package body to different extents in an entire reflowing process.) In the reflow soldering process, a maximum warpage value of the substrate is positively correlated with a failure probability of the solder ball. In addition, a smaller size of the solder ball indicates a larger probability that a failure of a head-in-pillow effect occurs on the solder ball because of warpage of the substrate. Because of a difference between CTEs of the FC-BGA chip, the substrate, and the PCB board, the solder ball is further exposed to a risk of a fatigue failure because the solder ball is subjected to long-term repeated thermal stresses during use of the chip.

SUMMARY

This application provides a stiffener ring and a surface packaging assembly to reduce warpage of the surface packaging assembly and reduce stress.

According to a first aspect, a stiffener ring is provided. The stiffener ring is configured to correct warpage of a substrate of a surface packaging assembly. The stiffener ring includes an annular stiffener ring body and an adjustment block that is disposed at a same layer as the stiffener ring body and that is fastened to at least one corner of the stiffener ring body. A coefficient of thermal expansion of the adjustment block is less than a coefficient of thermal expansion of the stiffener ring body: Coordination between the adjustment block and the stiffener ring body alleviates an "M-shape" overpressure phenomenon of a warpage deformation caused by the stiffener ring to the substrate at a high temperature, reduces warpage of the substrate, and improves flatness of the surface packaging assembly.

In a specific feasible solution, the stiffener ring body includes a material layer made of one material, and the coefficient of thermal expansion of the adjustment block is less than a coefficient of thermal expansion of the material layer. The stiffener ring uses a one-layer structure to adjust warpage of the substrate.

In a specific feasible solution, the stiffener ring body includes two material layers, and a lamination direction of the two material layers is perpendicular to a surface that is of the stiffener ring and that is used for being attached to the substrate. A warpage direction of thermal expansion of the stiffener ring body is opposite to a warpage direction of thermal expansion of the substrate. Warpage of the surface packaging assembly is offset by using a non-warpage feature of the stiffener ring or making a warpage direction of the stiffener ring opposite to the warpage direction of the substrate.

In a specific feasible solution, when the stiffener ring is laminated on the substrate, a coefficient of thermal expansion of a material layer close to the substrate is less than a coefficient of thermal expansion of a material layer away from the substrate; or a coefficient of thermal expansion of a material layer close to the substrate is greater than a coefficient of thermal expansion of a material layer away from the substrate. Warpage of the substrate can be reduced by using different arrangement manners of two different material layers.

In a specific feasible solution, the stiffener ring includes three material layers, and two outer material layers are material layers of a same coefficient of thermal expansion. A coefficient of thermal expansion of a middle material layer is different from the coefficient of thermal expansion of the outer material layers. Using a symmetrical structure design, the stiffener ring does not warp with temperature. A principle of controlling warpage of the substrate by the stiffener ring is similar to that of a single material. By designing a thickness ratio (a layer thickness ratio) of different material layers, the coefficient of thermal expansion and an elastic modulus of the stiffener ring can be customized to match substrates with different coefficients of thermal expansions.

In a specific feasible solution, material types of the material layer of the stiffener ring include but are not limited to iron-based alloy materials such as pure iron, carbon steel, and cast iron, for example, common stainless steel such as 201, 304, 316, 310, 410, 420, 430, and 440C, alloy materials with high coefficients of thermal expansion such as Fe-Ni22-Cr3, Fe-Ni20-Mn6, Fe-Ni13-Mn7, and Mn72-Cr18-Ni10, low expansion alloys such as Invar, Kovar, and Super Invar, and copper, aluminum, zinc, tin, lead, cobalt, nickel, tungsten, chromium, molybdenum, titanium, manganese, zirconium, and tungsten carbide and alloy materials thereof.

In a specific feasible solution, different metal layers of the stiffener ring are connected by using an adhesive, solder, a pure metal such as copper, aluminum, silver, or nickel, or an alloy, or may be directly connected in a common connection manner (such as laser welding or pressure diffusion welding) without an intermediate material layer.

In a specific feasible solution, the stiffener ring body has a first side wall and a second side wall that are opposite. A distance between the first side wall and a chip is less than a distance between the second side wall and the chip. The adjustment block includes a first adjustment block group and a second adjustment block group. The first adjustment block group includes at least one first adjustment block, and first adjustment blocks are disposed in a one-to-one correspondence at corners of the first side wall. The second adjustment block group includes at least one second adjustment block, and second adjustment blocks are disposed in a one-to-one correspondence at corners of the second side wall. A coefficient of expansion of the second adjustment block is less than a coefficient of expansion of the first adjustment block. Warpage when the chip is not at the center of the stiffener ring is reduced.

In a specific feasible solution, stiffness of the adjustment block is greater than stiffness of the stiffener ring body. Relatively large stiffness is used, so that the adjustment block has a relatively small coefficient of expansion.

In a specific feasible solution, the stiffener ring body includes at least one material layer, and the stiffness of the adjustment block is greater than stiffness of the material layer. The stiffener ring is formed by using two materials of different stiffness, to adjust warpage of the substrate.

In a specific feasible solution, the adjustment block is welded or bonded to the stiffener ring body: The adjustment block is fastened to the stiffener ring body through bonding or welding.

In a specific feasible solution, a gap is disposed at at least one corner of the stiffener ring body, and adjustment blocks are embedded in a one-to-one correspondence in gaps. The gap is disposed to accommodate the adjustment block, to ensure that an overall shape of the stiffener ring matches a shape of the substrate.

In a specific feasible solution, the adjustment block may be of a triangular structure, a circular structure, or a fan-shaped structure. Coordination between the stiffener ring and the substrate may be adjusted by using adjustment blocks of different shapes.

In a specific feasible solution, adjustment blocks may be disposed at one corner, two corners, or three corners of the stiffener ring.

In a specific feasible solution, an adjustment block may be further disposed along an edge of the stiffener ring, the adjustment block is annular, and is nested outside the stiffener ring body:

According to a second aspect, a stiffener ring is provided to correct warpage of a substrate. The stiffener ring is annular, and a warpage direction of thermal expansion of the stiffener ring is opposite to a warpage direction of thermal expansion of the corresponding substrate. Warpage of a surface packaging assembly is offset by making the warpage direction of the stiffener ring opposite to the warpage direction of the substrate.

In a specific feasible solution, the stiffener ring includes two material layers, and a lamination direction of the two material layers is perpendicular to a surface that is of the stiffener ring and that is used for being attached to the substrate.

A warpage direction of thermal expansion of a stiffener ring body is opposite to the warpage direction of thermal expansion of the substrate. Warpage of the stiffener ring is implemented by using two different material layers with different coefficients of expansion.

In a specific feasible solution, when the stiffener ring is laminated on the substrate, a coefficient of thermal expansion of a material layer close to the substrate is less than a coefficient of thermal expansion of a material layer away from the substrate; or a coefficient of thermal expansion of a material layer close to the substrate is greater than a coefficient of thermal expansion of a material layer away from the substrate.

In a specific feasible solution, a warpage value of thermal expansion of the stiffener ring increases as a heating temperature increases.

In a specific feasible solution, the stiffener ring is horizontal near a room temperature, and the warpage value of the stiffener ring becomes larger as the temperature increases. This is mainly used to correct a warpage deformation of the substrate at a high temperature.

In a specific feasible solution, a zero-warpage temperature of the stiffener ring is the same as a zero-warpage temperature of the substrate. A trend of a warpage deformation of the stiffener ring with temperature is opposite to that of the substrate, so that warpage deformations of the substrate at the room temperature and the high temperature are effectively corrected.

According to a third aspect, a stiffener ring is provided. The stiffener ring is configured to correct warpage of a substrate. The stiffener ring includes three material layers, and two outer material layers are material layers of a same coefficient of thermal expansion. A coefficient of thermal expansion of a middle material layer is different from the coefficient of thermal expansion of the outer material layers. Using a symmetrical structure design, the stiffener ring does not warp with temperature. A principle of controlling warpage of the substrate by the stiffener ring is similar to that of a single material. By designing a thickness ratio (a layer thickness ratio) of different material layers, a coefficient of thermal expansion and an elastic modulus of the stiffener ring can be customized to match substrates with different coefficients of thermal expansions.

According to a fourth aspect, a surface packaging assembly is provided. The surface packaging assembly includes a laminated substrate and a chip. The substrate is electrically connected to the chip. The surface packaging assembly further includes the stiffener ring in any one of the foregoing descriptions.

The stiffener ring is sleeved outside the chip, and the stiffener ring is laminated on and fastened to the substrate. Warpage of the surface packaging assembly is offset and flatness of the surface packaging assembly is improved by using a non-warpage feature of the stiffener ring or making a warpage direction of the stiffener ring opposite to a warpage direction of the substrate.

DESCRIPTION OF EMBODIMENTS

To make objectives, technical solutions, and advantages of this application clearer, the following further describes this application in detail with reference to the accompanying drawings.

Figure 1A:
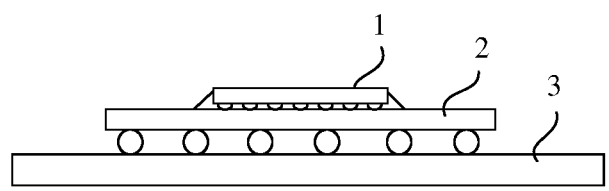
FIG. 1a is a schematic diagram of a surface packaging structure in the conventional technology.
Figure 1B:
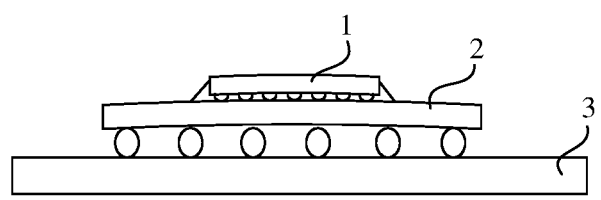
FIG. 1b and FIG. 1c are schematic diagrams of a deformation of a surface packaging structure in the conventional technology.
Figure 1C:
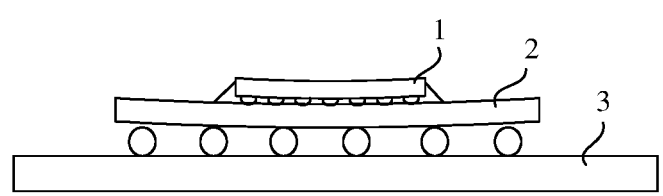
Figure 2:
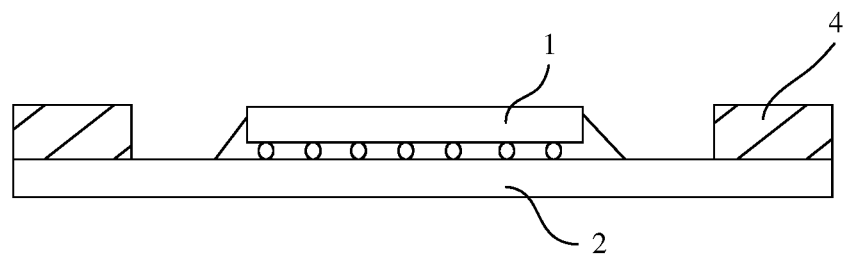
FIG. 2 is a schematic diagram of a surface packaging structure with a stiffener ring in the conventional technology.

First, an application scenario of a stiffener ring disclosed in this application is described. The stiffener ring provided in embodiments of this application is applied to a surface packaging assembly. FIG. 1a shows an example of a structure of a surface packaging assembly in the conventional technology; The surface packaging assembly includes a substrate 2 and a chip 1 disposed above the substrate 2. The chip 1 is soldered to the substrate 2 by using pads, and is bonded and fastened to the substrate 2 by using an adhesive. When the surface packaging assembly is soldered to a PCB board 3, warpage occurs on the substrate 2 because of impact of a temperature. As shown in FIG. 1b and FIG. 1c, when no stiffener ring is included, warpage occurs on the surface packaging assembly within a reflow soldering temperature range, and there are three forms of warpage deformations. At a room temperature, a crying face warpage deformation occurs on the package body, the warpage deformation gradually becomes smaller as the temperature increases, and the package body becomes approximately horizontal at a zero-warpage temperature. A zero-stress temperature is related to a solidification temperature of an underfill material, and is usually 100° C. to 200° C. When the temperature exceeds the zero-stress temperature, "smiling face" warpage occurs on the packaging structure, and a warpage value becomes larger as the temperature increases. At the room temperature, a relatively large "crying face" warpage deformation occurs on a few surface packaging assemblies, a warpage value becomes smaller as the temperature increases, and at a peak temperature of reflow soldering, the warpage value is the smallest: or at the room temperature, a "smiling face" warpage deformation occurs, a warpage value becomes larger as the temperature increases, and the "smiling face" warpage value is the largest at a peak temperature of reflow soldering. As shown in FIG. 2, to reduce warpage of the substrate 2, in the conventional technology, a combination of a stiffener ring 4 and the substrate 2 is used. However, a CTE (Thermal Expansion Coefficient, coefficient of thermal expansion) of the stiffener ring 4 in the conventional technology is a fixed value, and the stiffener ring 4 cannot best match the substrate 2. Therefore, an embodiment of this application provides a stiffener ring. The following describes the stiffener ring in detail with reference to specific accompanying drawings and embodiments.

For ease of understanding, a direction a is first defined, and the direction a is perpendicular to a surface that is of a substrate and on which a chip is disposed.

Figure 3:
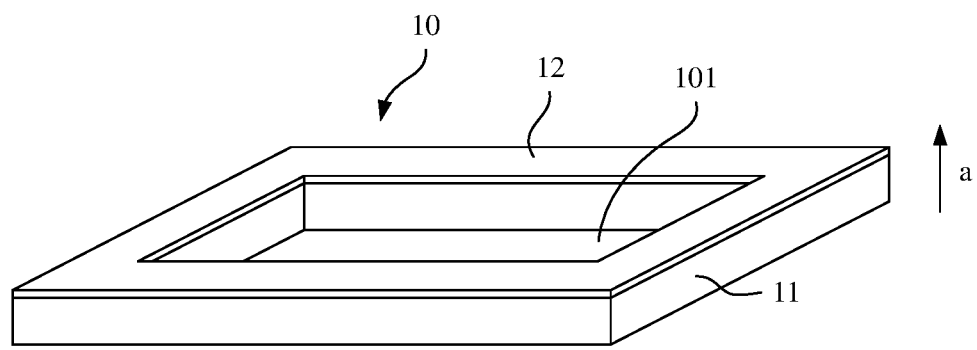
FIG. 3 is a schematic diagram of a specific structure of a stiffener ring according to an embodiment of this application.

FIG. 3 shows an example of a schematic diagram of a specific structure of a stiffener ring according to an embodiment of this application. A stiffener ring 10 is of an annular structure, and a hollow part 101 in the middle may be used for being sleeved on a chip. For example, the stiffener ring 10 may use different annular structures. For example, the stiffener ring may be of different shapes such as a square ring, a circular ring, and an oval ring, provided that the stiffener ring is adapted to the substrate. A specific annular structure is not specifically limited in this application. The stiffener ring 10 provided in this embodiment of this application is a structure with thermal expansion. After the stiffener ring 10 is heated, bending and warpage occur on the stiffener ring 10, and a warpage direction of thermal expansion is opposite to a warpage direction of thermal expansion of a corresponding substrate. Warpage of the stiffener ring 10 is implemented by using material layers with different coefficients of expansion. The stiffener ring 10 provided in this embodiment of this application includes two laminated material layers, and a lamination direction (the direction a)

of the two material layers is perpendicular to a surface that is of the stiffener ring 10 and that is used for being attached to the substrate. The stiffener ring 10 shown in FIG. 3 is divided into two layers in the direction a: a first material layer 11 and a second material layer 12. A coefficient of thermal expansion of the first material layer 11 is different from that of the second material layer 12. For example, the first material layer 11 may use a material with a low coefficient of thermal expansion, and the second material layer 12 may use a material with a high coefficient of thermal expansion; or the first material layer 11 uses a material with a high coefficient of thermal expansion, and the second material layer 12 uses a material with a low coefficient of thermal expansion.

In this embodiment of this application, thicknesses of the first material layer 11 and the second material layer 12 in the direction a are not specifically limited. The first material layer 11 and the second material layer 12 are material layers with same or different thicknesses, and specifically, specific thicknesses of the first material layer 11 and the second material layer 12 may be properly designed based on warpage of a corresponding substrate 40.

Figure 4:
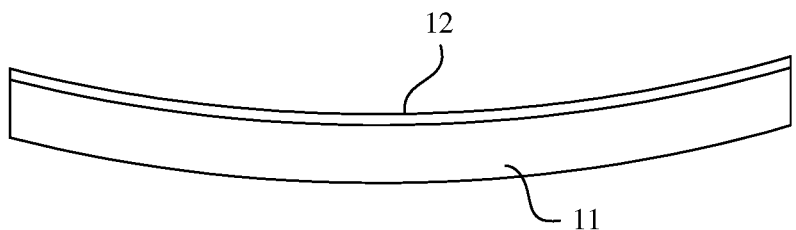
FIG. 4 is a schematic diagram of a type of warpage of a stiffener ring according to an embodiment of this application.

When the first material layer 11 and the second material layer 12 use materials with different coefficients of thermal expansion, the warpage direction of thermal expansion of the stiffener ring 10 is also different. FIG. 4 shows warpage when the first material layer 11 uses the material with the high coefficient of thermal expansion and the second material layer 12 uses the material with the low coefficient of thermal expansion. Because the first material layer 11 is thermally expanded to a larger extent after being heated, and the second material layer 12 is thermally expanded to a smaller extent, the entire stiffener ring 10 warps upward (where a placement direction of the stiffener ring 10 shown in FIG. 4 is used as a reference direction) to form "smiling face" warpage. When a plurality of material layers, for example, three or four material layers, exist in the stiffener ring 10, coefficients of thermal expansion of at least two material layers are different, and a coefficient of thermal expansion of a material layer close to the substrate is greater than a coefficient of thermal expansion of a material layer away from the substrate.

Figure 5:
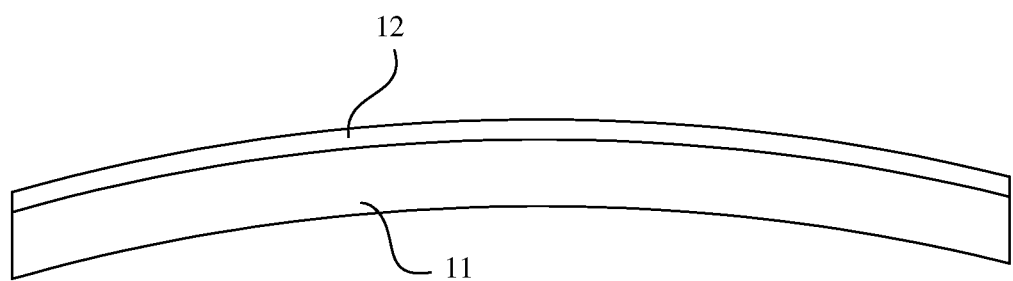
FIG. 5 is a schematic diagram of another type of warpage of a stiffener ring according to an embodiment of this application.

As shown in FIG. 5, the first material layer 11 uses the material with the low coefficient of thermal expansion, and the second material layer 12 uses the material with the high coefficient of expansion. Because the first material layer 11 is thermally expanded to a smaller extent after being heated, and the second material layer 12 is thermally expanded to a larger extent, the entire stiffener ring 10 warps downward (where a placement direction of the stiffener ring 10 shown in FIG. 5 is used as a reference direction) to form "crying face" warpage. When a plurality of material layers, for example, three or four material layers, exist in the stiffener ring 10, coefficients of thermal expansion of at least two material layers are different. When the stiffener ring 10 is laminated on the substrate, in any two material layers, a coefficient of thermal expansion of a material layer close to the substrate is less than a coefficient of thermal expansion of a material layer away from the substrate 40).

For example, when the foregoing structures shown in FIG. 4 and FIG. 5 are used, material types of the first material layer 11 and the second material layer 12 of the stiffener ring 10 include but are not limited to iron-based alloy materials such as pure iron, carbon steel, and cast iron, for example, common stainless steel of different models such as 201, 304, 316, 310, 410, 420, 430, and 440C, alloy materials with high coefficients of thermal expansion such as Fe-Ni22-Cr3, Fe-Ni20-Mn6, Fe-Ni13-Mn7, and Mn72-Cr18-Ni10, low expansion alloys such as Invar, Kovar, and Super Invar, and copper, aluminum, zinc, tin, lead, cobalt, nickel, tungsten, chromium, molybdenum, titanium, manganese, zirconium, and tungsten carbide and alloy materials thereof. Other known materials may be alternatively used. When the first material layer 11 and the second material layer 12 use the foregoing materials, only the coefficient of thermal expansion of the first material layer 11 and that of the second material layer 12 need to be different.

In this embodiment of this application, the first material layer 11 and the second material layer 12 may be connected in different manners. For example, the first material layer 11 and the second material layer 12 may be connected by using an adhesive, solder, a pure metal such as copper, aluminum, silver, or nickel, or an alloy, or may be directly connected in a common connection manner (such as laser welding or pressure diffusion welding) without an intermediate material layer. This is not specifically limited in this embodiment of this application.

In the foregoing embodiment, when the first material layer 11 and the second material layer 12 of the stiffener ring 10 are designed as an asymmetric structure, because the coefficient of thermal expansion of the first material layer 11 does not match that of the second material layer 12, as a temperature changes, different warpage deformations occur on the stiffener ring 10 formed by lamination and composition, and a principle is similar to that of a thermal bimetal plate. When a layer that is of the stiffener ring 10 and that is close to the substrate uses a material whose coefficient of thermal expansion is less than that of an outer material, a proper composite technology and a proper temperature are selected, or a post-processing technology such as shape correction is used, so that a zero-warpage temperature of the stiffener ring 10 is consistent with a zero-warpage temperature of the substrate. A warpage value of thermal expansion of the stiffener ring 10 increases as a heating temperature increases, and a trend of a warpage deformation of the stiffener ring 10 with temperature is opposite to a trend of a warpage deformation of the substrate with temperature, so that warpage deformations of the substrate 40 at a room temperature and a high temperature are effectively corrected. Alternatively, composite temperature control and the shape correction technology may be used, so that the stiffener ring 10 is horizontal near the room temperature (−50° C. to 100° C.), and the warpage value of the stiffener ring 10 becomes larger as the temperature increases. This is mainly used to correct a warpage deformation of the substrate at a high temperature. Although only a warpage deformation of the package body at the high temperature can be corrected, costs of the technology are relatively low; and mass production is easy.

Figure 6A:
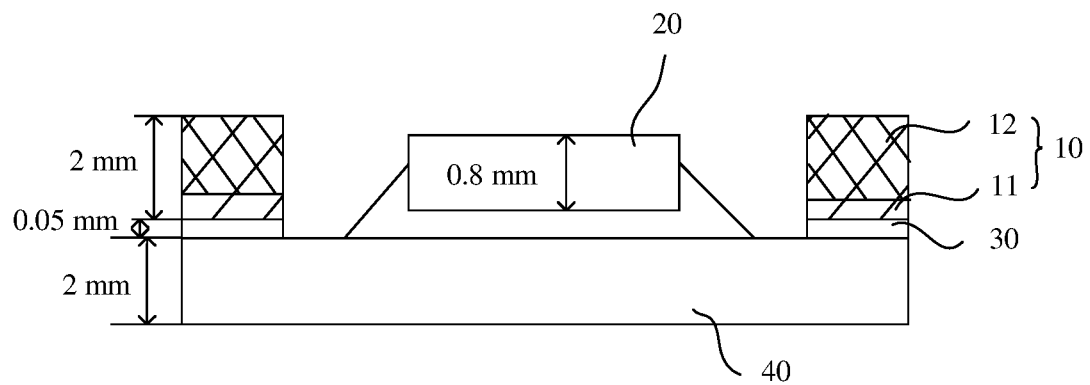
FIG. 6a is a schematic diagram of a structure in which a stiffener ring is applied to a surface packaging assembly according to an embodiment of this application.
Figure 6B:
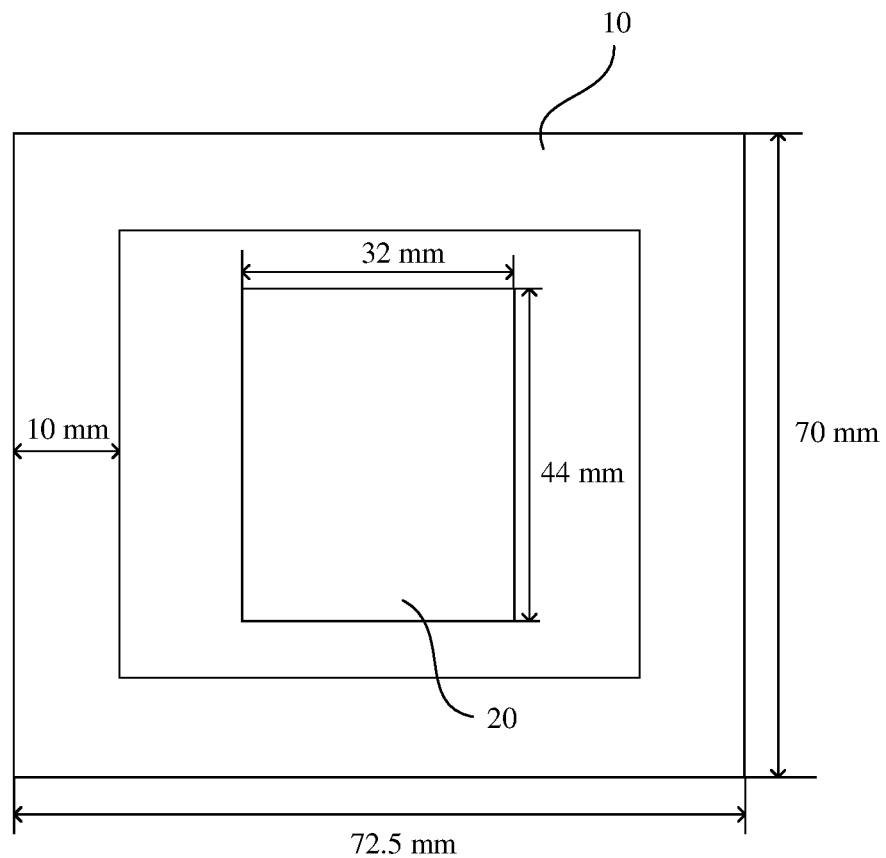
FIG. 6b is a top view in which a stiffener ring is applied to a surface packaging assembly according to an embodiment of this application.

To facilitate understanding of an effect of the stiffener ring 10 provided in this embodiment of this application, a surface packaging assembly shown in FIG. 6a and FIG. 6b is used as an example for description in this application. Dimensions of the surface packaging assembly shown in FIG. 6a and FIG. 6b are shown in Table 1.

TABLE 1

| Material | Dimensions |
| --- | --- |
| Stiffener ring | Height = 2 mm and width = 10 mm |
| Substrate | 72.5 mm * 70 mm * 2 mm |
| Underfill material | Height = 0.07 mm and width = 2 mm |
| Chip | 32 mm * 44 mm * 0.8 mm |

Figure 7:
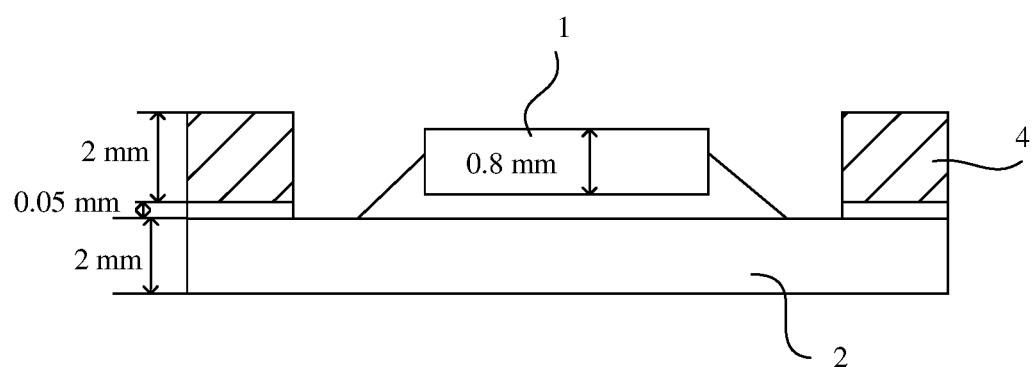
FIG. 7 is a schematic diagram of a structure of a surface packaging assembly that has a stiffener ring and that is used for comparison in the conventional technology.

In FIG. 6a and FIG. 6b, the stiffener ring 10 is bonded to the substrate 40 by using a thermosetting adhesive 30, and a comprehensive coefficient of thermal expansion of the substrate 40 is 14. For ease of understanding, in the conventional technology, a stiffener ring 4 of 304 stainless steel (a single material) is used, and a thickness of the stiffener ring 4 is 2 mm, as shown in FIG. 7. In the stiffener ring 10 in this embodiment of this application, the second material layer 12 uses 304 stainless steel (CTE=17) of a thickness of 1.8 mm, and the first material layer 11 uses tungsten (CTE=4) of a thickness of 0.2 mm. The first material layer 11 is attached to the substrate 40. The stiffener ring 10 provided in this embodiment of this application is designed as an asymmetric structure, and the coefficient of thermal expansion of the second material layer 12 is greater than the coefficient of thermal expansion of the first material layer 11. Therefore, warpage occurs on the stiffener ring 10 as a temperature changes. A zero-stress temperature of the surface packaging assembly is about 150° C. The composite technology and the shape correction technology are adjusted for the stiffener ring 10 to keep a zero-stress temperature of the stiffener ring 10 consistent with the zero-stress temperature of the surface packaging assembly, so that the zero-warpage temperature of the stiffener ring 10 is the same as the zero-warpage temperature of the substrate 40.

For two types of stiffener rings and a case in which no stiffener ring is added to the surface mount assembly, warpage degrees of the substrate at the room temperature (25 degrees Celsius) and a peak temperature (260 degrees Celsius) of reflow soldering are compared. Results are shown in Table 2.

TABLE 2

| Warpage value of a substrate | 25° C. | 260° C. |
|---|---|---|
| No stiffener ring is mounted | 428.3 μm | 333.9 μm |
| Stiffener ring of 304 stainless steel | 227.6 μm | 139.8 μm |
| Composite stiffener ring of 304 stainless steel plus tungsten | 201.5 μm | 119 μm |

It can be learned from Table 2 that, when a stiffener ring of a single material (stainless steel) is used, although warpage of the substrate at the room temperature and the peak temperature of reflow soldering is reduced, the stiffener ring provided in this embodiment of this application is better controlled at both the normal temperature and the peak temperature of reflow soldering by using a composite structure. The stiffener ring provided in this embodiment of this application separately implements optimization of 11.5% and 14.9% compared with the stiffener ring of a single material. Warpage of the packaging assembly is greatly reduced. In addition, it can be learned from the foregoing comparison that a thickness of the stiffener ring provided in this embodiment of this application is capable of being unchanged.

The stiffener ring 10 shown in FIG. 6a and FIG. 6b may alternatively use another composite material. For example, the first material layer 11 and the second material layer 12 may use 304 stainless steel plus Invar, or 304 stainless steel plus 430 stainless steel, or two high expansion stainless steel composite material layers, and the zero-stress temperature of the surface mount assembly is 150° C. The zero-stress temperature of the stiffener ring 10 in this embodiment is 25° C. A stiffener ring 10 in which the first material layer 11 and the second material layer 12 use 304 stainless steel and Invar stainless steel is used as an example for comparison with a stiffener ring of a single material and of a same height in the conventional technology. For warpage of the substrate at the room temperature and the peak temperature of reflow soldering, refer to Table 3.

TABLE 3

| Warpage value of a substrate | 25° C. | 260° C. |
|---|---|---|
| Stiffener ring of 304 stainless steel | 227.6 μm | 139.8 μm |
| Composite stiffener ring of 304 stainless steel plus Invar | 226.3 μm | 106.3 μm |

As shown in Table 3, when the first material layer 11 and the second material layer 12 use 304 stainless steel plus Invar, a warpage value of the package body at the peak temperature of reflow soldering is better controlled while a height of the stiffener ring is not increased. Optimization of 24% is implemented in comparison with a stiffener ring of a single material.

It can be learned from the foregoing examples that the stiffener ring formed by two material layers provided in this embodiment of this application can effectively reduce warpage of the substrate. The stiffener ring provided in this embodiment of this application may be further extended to a plurality of layers. For example, the stiffener ring includes at least two material layers such as three or four layers that are arranged in the direction a and whose coefficients of thermal expansion gradually increase or decrease in the direction a.

Figure 8:
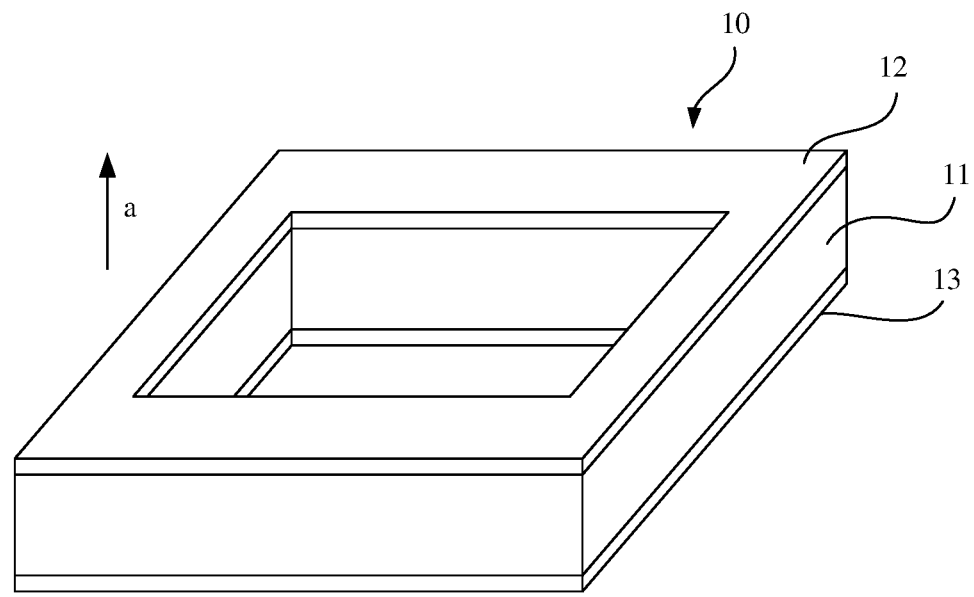
FIG. 8 is a schematic diagram of a specific structure of a stiffener ring according to an embodiment of this application.

As shown in FIG. 8, another stiffener ring is provided. The stiffener ring 10 includes three material layers: a first material layer 11, a second material layer 12, and a third material layer 13. Two outer material layers (the second material layer 12 and the third material layer 13) are material layers of a same coefficient of thermal expansion. A coefficient of thermal expansion of a middle material layer (the first material layer 11) is different from the coefficient of thermal expansion of the outer material layers. When a three-layer structure is used, the stiffener ring 10 is designed as a symmetrical structure (where the two outer material layers are symmetrical) in a direction a, and the stiffener ring 10 does not warp with temperature. A principle of controlling warpage of a substrate by the stiffener ring 10 is similar to that of a single material. By designing a thickness ratio (a layer thickness ratio) of different material layers (the first material layer 11, the second material layer 12, and the third material layer 13), a coefficient of thermal expansion and an elastic modulus of the stiffener ring 10 can be customized to match substrates with different coefficients of thermal expansions.

For example, material types of the first material layer 11, the second material layer 12, and the third material layer 13 of the stiffener ring 10 include but are not limited to iron-based alloy materials such as pure iron, carbon steel, and cast iron, for example, common stainless steel of different models such as 201, 304, 316, 310, 410, 420, 430, and 440C, alloy materials with high coefficients of thermal expansion such as Fe-Ni22-Cr3, Fe-Ni20-Mn6, Fe-Ni13-Mn7, and Mn72-Cr18-Ni10, low expansion alloys such as Invar, Kovar, and Super Invar, and copper, aluminum, zinc, tin, lead, cobalt, nickel, tungsten, chromium, molybdenum, titanium, manganese, zirconium, and tungsten carbide and alloy materials thereof. Other known materials may be alternatively used. When the first material layer 11, the second material layer 12, and the third material layer 13 use the foregoing materials, only the coefficient of thermal expansion of the first material layer 11 and that of the second material layer 12 need to be different.

In this embodiment of this application, the first material layer 11, the second material layer 12, and the third material layer 13 may be connected in different manners. For example, the first material layer 11, the second material layer 12, and the third material layer 13 may be connected by using an adhesive, solder, a pure metal such as copper, aluminum, silver, or nickel, or an alloy, or may be directly connected in a common connection manner (such as laser welding or pressure diffusion welding) without an intermediate material layer. This is not specifically limited in this embodiment of this application.

In FIG. 8, the stiffener ring 10 uses a sandwich structure with tungsten of a thickness of 0.2 mm, 304 stainless steel of a thickness of 1.6 mm, and tungsten of a thickness of 0.2 mm from top to bottom. The stiffener ring shown in FIG. 8 is applied to the surface mount assembly in FIG. 6a. For dimensions, refer to Table 1. For two types of stiffener rings 10 (the stiffener ring 10 shown in FIG. 8 and the stiffener ring 10 shown in FIG. 7) and a case in which no stiffener ring is added to the surface mount assembly, warpage degrees of the substrate at a room temperature (25 degrees Celsius) and a peak temperature (260 degrees Celsius) of reflow soldering are compared. A stiffener ring of a 304 stainless steel material is used for comparison. Results are shown in Table 4.

TABLE 4

| Warpage value of a substrate | 25° C. | 260° C. |
|---|---|---|
| No stiffener ring is mounted | 428.3 μm | 333.9 μm |
| Stiffener ring of 304 stainless steel | 227.6 μm | 139.8 μm |
| Composite stiffener ring 10 of tungsten plus 304 | 207.8 μm | 127.1 μm |
| Warpage value of a substrate stainless steel plus tungsten | 25° C. | 260° C. |

As shown in Table 4, a surface packaging assembly using a structure of a composite stiffener ring of tungsten plus stainless steel plus tungsten is better controlled at the normal temperature and the peak temperature of reflow soldering and is separately optimized by 8.7% and 9.1% compared with the stiffener ring of single 304 stainless steel.

When a CTE of the substrate is obviously less than that of the stiffener ring, the substrate is subject to overpressure of the stiffener ring at the peak temperature (which depends on a melting point of a solder ball, and is usually 200° C. to 300° C.) of reflow soldering, an M-shaped warpage deformation occurs on the substrate, and an overall warpage value increases. In addition, in the case of this type of warpage deformation, a solder ball at a corner is affected by gravity of the package body, and is prone to a bridging short-circuit, causing a packaging failure. In view of this, an embodiment of this application provides another stiffener ring. The stiffener ring provided in this embodiment of this application includes an annular stiffener ring body and an adjustment block that is disposed at a same layer as the stiffener ring body and that is fastened to at least one corner of the stiffener ring body. A coefficient of thermal expansion of the adjustment block is less than a coefficient of thermal expansion of the stiffener ring body, and stiffness of the adjustment block is greater than stiffness of the stiffener ring body. The following describes the stiffener ring with reference to specific accompanying drawings.

Figure 9:
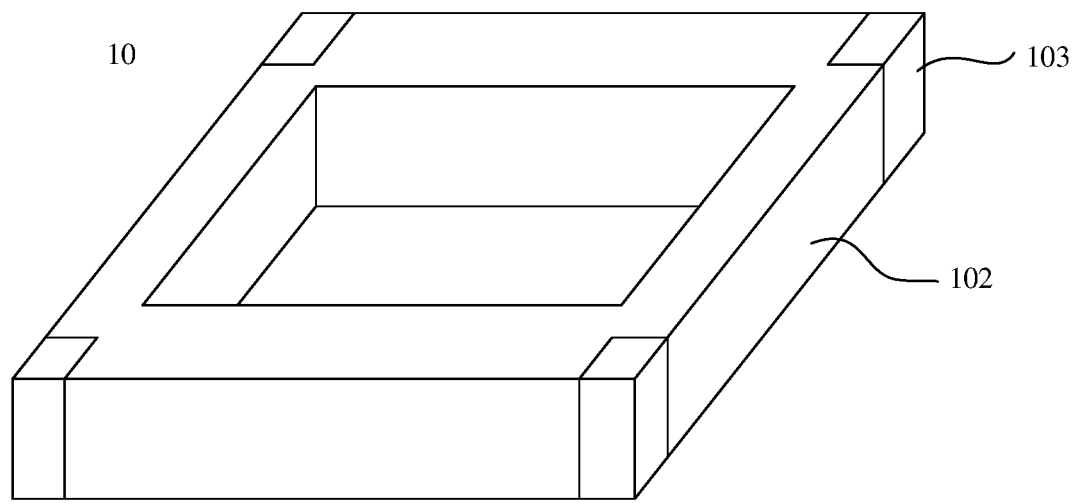
FIG. 9 is a schematic diagram of a specific structure of a stiffener ring according to an embodiment of this application.

FIG. 9 shows an example of a specific stiffener ring 10. A stiffener ring body 102 includes a material layer made of one material. Gaps are disposed at four corners of the stiffener ring body 102. An adjustment block 103 is embedded in each gap. Because a shape of the gap matches a shape of the adjustment block 103, the gaps are not marked in FIG. 9. For the shape of the gap, refer to the shape of the adjustment block 103. An "M-shape" overpressure phenomenon of a warpage deformation caused by the stiffener ring 10 to a substrate 40 at a high temperature is alleviated by using the four corners of the body of the stiffener ring 10, to obtain a more flat warpage deformation.

Material types of material layers of the stiffener ring body 102 and the adjustment block include but are not limited to iron-based alloy materials such as pure iron, carbon steel, and cast iron, for example, common stainless steel of different models such as 201, 304, 316, 310, 410, 420, 430, and 440C, alloy materials with high coefficients of thermal expansion such as Fe-Ni22-Cr3, Fe-Ni20-Mn6, Fe-Ni13-Mn7, and Mn72-Cr18-Ni10, low expansion alloys such as Invar, Kovar, and Super Invar, and copper, aluminum, zinc, tin, lead, cobalt, nickel, tungsten, chromium, molybdenum, titanium, manganese, zirconium, and tungsten carbide and alloy materials thereof.

Other known materials may be alternatively used. A coefficient of thermal expansion of the adjustment block 103 is less than a coefficient of thermal expansion of the stiffener ring body 102, and stiffness of the adjustment block 103 is greater than stiffness of the stiffener ring body 102. For example, the adjustment block is made of a material that is of a low CTE (low expansion) and that is insensitive to a temperature change. For example, the adjustment block uses a material such as an Invar alloy (CTE=2) or tungsten (CTE=3.5). The foregoing materials have relatively large elastic moduli (relatively large stiffness) and relatively low coefficients of thermal expansion.

Figure 10:
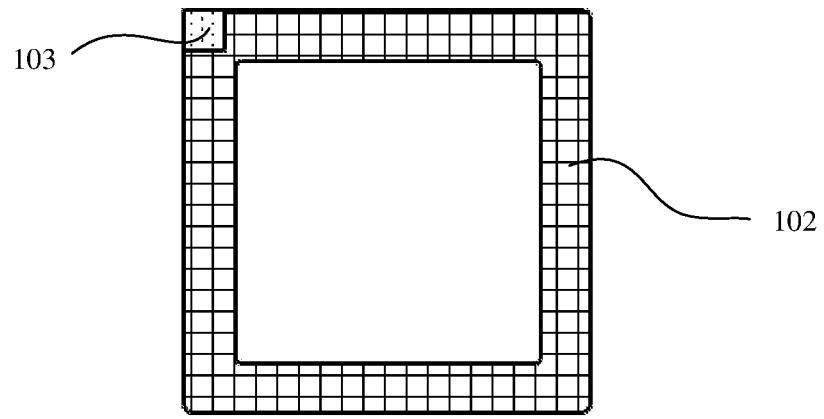
FIG. 10 is a schematic diagram of a specific structure of a stiffener ring according to an embodiment of this application.

FIG. 10 shows an example of a transformation of that in FIG. 9. A gap is disposed at only one corner of the stiffener ring body 102, and the adjustment block 103 is embedded in the gap. The adjustment block 103 may be fastened to the stiffener ring body 102 through welding or bonding or may be connected to the stiffener ring body 102 in another known manner. It should be understood that a quantity of adjustment blocks 103 in this application may be set based on a requirement. For example, adjustment blocks 103 of different quantities are shown in FIG. 9 and FIG. 10. In addition to the adjustment blocks 103 shown in FIG. 9 and FIG. 10, adjustment blocks 103 may be disposed at two corners or three corners of the stiffener ring body 102, and a disposing manner is the same as the manner shown in FIG. 9 and FIG. 10. Details are not described herein again.

Figure 11A:
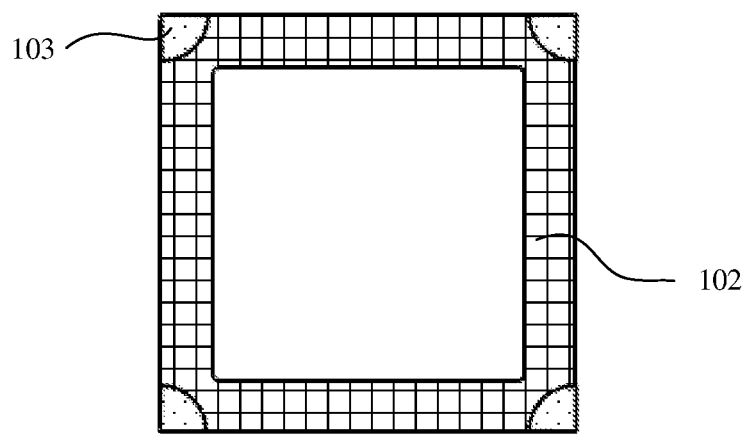
FIG. 11a and FIG. 11b are schematic diagrams of a specific structure of a stiffener ring according to an embodiment of this application.
Figure 11B:
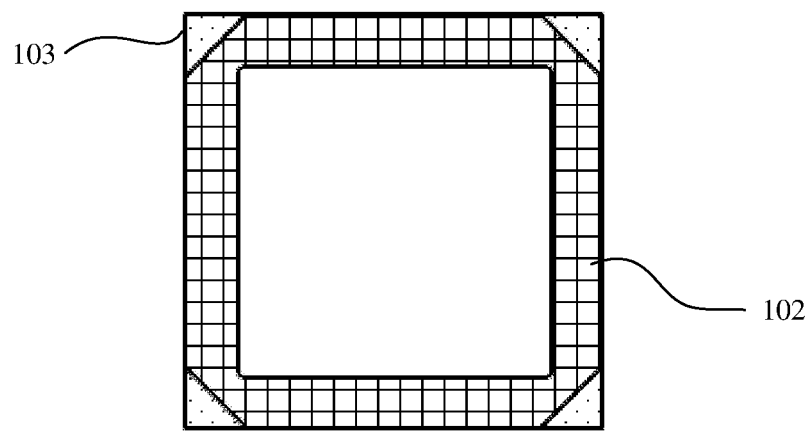

In an optional implementation, the gap provided in this embodiment of this application may be of different shapes. For example, the gap is triangular, circular, or fan-shaped. A corresponding adjustment block 103 is of a shape that matches the gap, and the adjustment block 103 is also of a structure such as a triangular structure, a circular structure, or a fan-shaped structure. For example, the adjustment block 103 shown in FIG. 9 is rectangular, an adjustment block 103 shown in FIG. 11a is fan-shaped, and an adjustment block 103 shown in FIG. 11b is triangular. Certainly, the adjustment block 103 provided in this embodiment of this application may further use another shape, provided that the "M-shape" overpressure phenomenon of the warpage deformation caused by the stiffener ring 10 to the substrate 40 at the high temperature can be alleviated to obtain a more flat warpage deformation.

Figure 12:
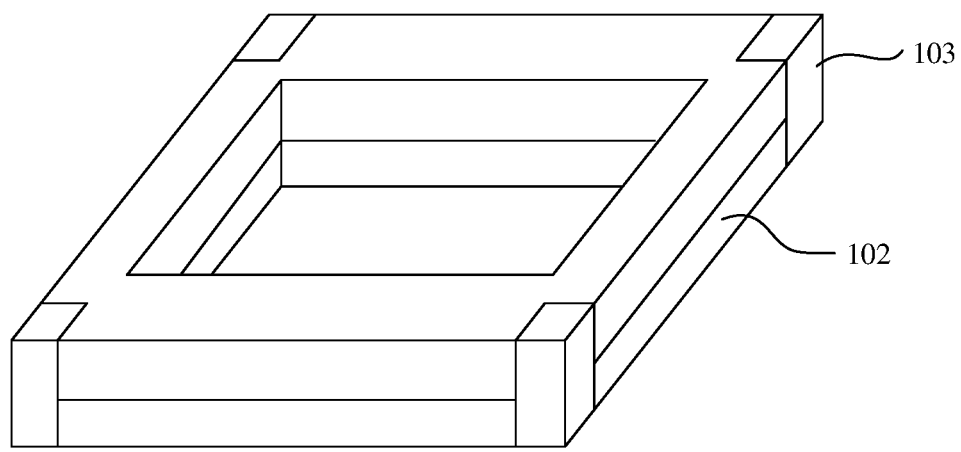
FIG. 12 is a schematic diagram of a specific structure of a stiffener ring according to an embodiment of this application.

FIG. 12 shows an example of a structure of another stiffener ring 10. Differences between the another stiffener ring 10 and the stiffener ring 10 shown in FIG. 9 are as follows: A stiffener ring body 102 shown in FIG. 12 uses at least two material layers, and only two material layers are used as an example in FIG. 12. For materials and a connection manner of the two material layers, refer to related descriptions of the materials and the connection manner of the first material layer and the second material layer in FIG. 3. The stiffener ring in FIG. 12 may be understood as one obtained by opening gaps at corners on the basis of the stiffener ring shown in FIG. 3 and then embedding adjustment blocks 103 in the gaps. The stiffener ring shown in FIG. 12 may also be extended to a plurality of material layers. In other words, the stiffener ring body 102 may be composed of a plurality of (such as three or four) material layers, and the plurality of material layers may use different coefficients of expansion shown in FIG. 3, so that the stiffener ring body 102 can warp, and a warpage direction is opposite to a warpage direction of a substrate.

Figure 13:
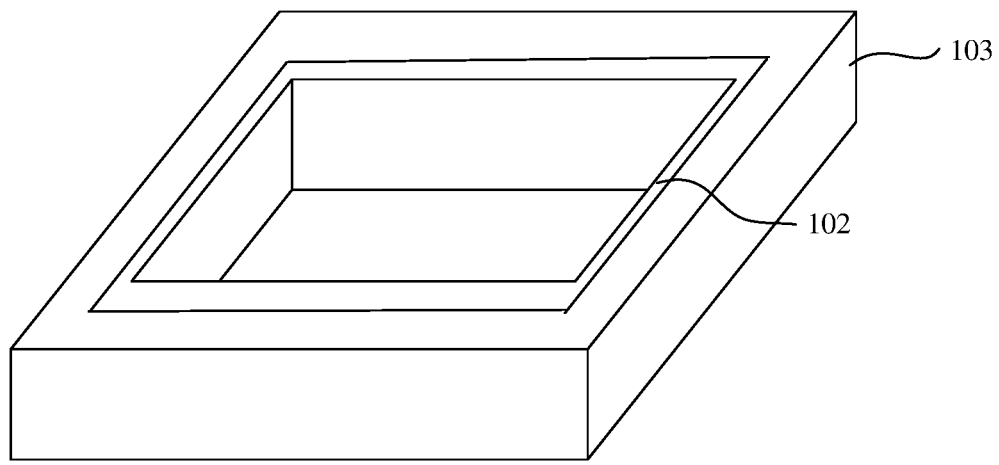
FIG. 13 is a schematic diagram of a specific structure of a stiffener ring according to an embodiment of this application.

FIG. 13 shows an example of a structure of a third stiffener ring 10. Differences between the third stiffener ring 10 and the stiffener ring 10 shown in FIG. 9 are as follows: A gap may be further disposed along an edge of the stiffener ring 10. In this case, an adjustment block 103 is of an annular structure, and the adjustment block 103 is nested outside a stiffener ring body 102. The stiffener ring body 102 and the adjustment block 103 may separately use different annular structures. For example, the stiffener ring body 102 and the adjustment block 103 may be of different shapes such as a square ring, a circular ring, and an oval ring, provided that the stiffener ring body 102 and the adjustment block 103 are adapted to a substrate. A specific annular structure is not specifically limited in this application. When the annular structure is used, the stiffener ring body 102 may be made of one layer of material, or may be made of two layers of materials. For details, refer to the material layer of the stiffener ring body in FIG. 9 and FIG. 12. Details are not described herein again.

To facilitate understanding of the foregoing stiffener ring 10 provided as an example in this application, the stiffener ring 10 shown in FIG. 9 is used as an example for description. An example in which the stiffener ring body 102 uses 304 stainless steel of a thickness of 2 mm and adjustment blocks 103 at four corners are of an Invar alloy is used. For the stiffener ring 10 in FIG. 9, a stiffener ring of a single material in the conventional technology, and a case in which no stiffener ring is added to the surface mount assembly, warpage degrees of the substrate at the room temperature (25 degrees Celsius) and the peak temperature (260 degrees Celsius) of reflow soldering are compared. A stiffener ring of a 304 stainless steel material is used for comparison. Results are shown in Table 5.

TABLE 5

| Warpage value of a substrate | 25° C. | 260° C. |
|---|---|---|
| No stiffener ring is mounted | 428.3 μm | 333.9 μm |
| Stiffener ring of 304 stainless steel | 227.6 μm | 139.8 μm |
| Composite stiffener ring of tungsten plus 304 stainless steel plus tungsten | 214.3 μm | 125 μm |

It can be learned from Table 5 that, when the stiffener ring of single 304 stainless steel is used, because a CTE of the stiffener ring of single 304 stainless is greater than that of the substrate, a deformation of the substrate is excessively corrected, and M-shaped and W-shaped deformations occur on the substrate at the room temperature and the peak temperature of reflow soldering. Four corners are the lowest (highest) at the room temperature (high temperature). However, a surface packaging assembly using a structure of a composite stiffener ring of tungsten plus stainless steel plus tungsten is better controlled at the normal temperature and the peak temperature of reflow soldering and is separately optimized by 5.8% and 10.6% compared with the stiffener ring of single 304 stainless steel.

It can be learned from the foregoing description that embodiments of this application provide a plurality of stiffener rings, to better control a warpage deformation of the surface packaging assembly with temperature. The warpage deformation of the surface packaging assembly with temperature can be better controlled while a width and a height of the stiffener ring are not increased. In addition, a CTE matching the substrate is customized for the stiffener ring by using a layer thickness ratio design and selecting material types of a layered composite material. In addition, after the stiffener ring is attached to the substrate, the warpage deformation of the surface packaging assembly with temperature can be optimized.

Figure 14:
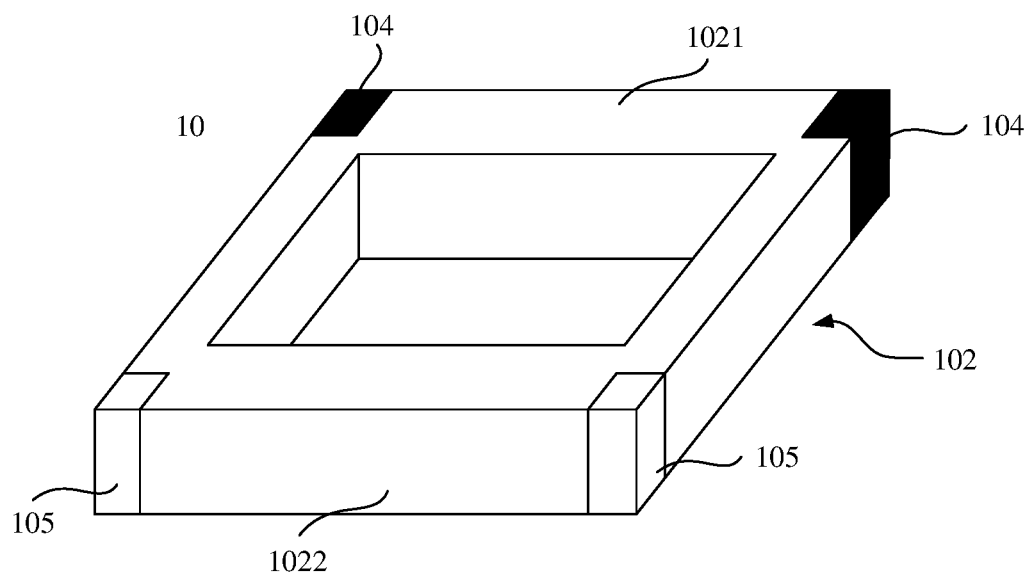
FIG. 14 is a schematic diagram of a specific structure of a stiffener ring according to an embodiment of this application.
Figure 15:
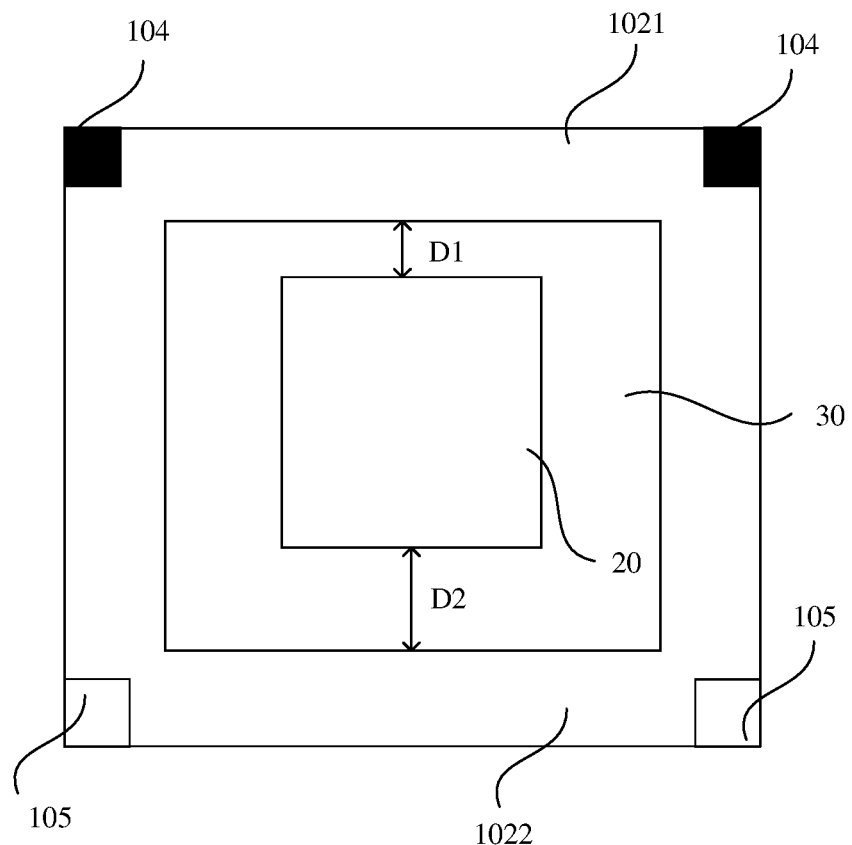
FIG. 15 is a schematic diagram of application of the stiffener ring shown in FIG. 13.

Refer to FIG. 14 and FIG. 15. FIG. 14 is a schematic diagram of a structure of another stiffener ring, and FIG. 15 is a schematic diagram of application of the stiffener ring shown in FIG. 14. When the stiffener ring 10 is used, a chip 20 is disposed inside the stiffener ring body 102. When a relative position between the chip 20 and a stiffener ring body 102 changes, warpage of a substrate 30 also changes. When eccentricity of the chip 20 relative to the substrate 30 in a vertical direction exists, four corners of the substrate 30 are asymmetrically deformed at a high temperature, leading to a change of warpage of the substrate 30. To reduce warpage in the foregoing cases, adaptive changes are made to the stiffener ring 10 shown in FIG. 14 and FIG. 15.

Further referring to FIG. 14 and FIG. 15, two side walls of the stiffener ring body 102 are defined by using the chip 20 as a reference object. The stiffener ring body 102 has a first side wall 1021 and a second side wall 1022 that are opposite. As shown in FIG. 15, a distance D1 between the first side wall 1021 and the chip 20 is less than a distance D2 between the second side wall 1022 and the chip 20, in other words, D1<D2. Therefore, warpage of the substrate 30 at the second side wall 1022 is larger than warpage of the substrate 30 at the first side wall 1021. To reduce the foregoing warpage, adjustment blocks include a first adjustment block group and a second adjustment block group. The first adjustment block group is located on the first side wall 1021, and the second adjustment block group is located on the second side wall 1022.

Referring to FIG. 14, the first adjustment block group includes at least one first adjustment block 104. For example, there are two first adjustment blocks 104, and the two first adjustment blocks 104 are disposed in a one-to-one correspondence at corners of two ends of the first side wall 1021. The second adjustment block group includes at least one second adjustment block 105. For example, there are two second adjustment blocks 105, and the two second adjustment blocks 105 are disposed in a one-to-one correspondence at corners of two ends of the second side wall 1022. Because D1<D2, a vertical distance between the first adjustment block 104 and the chip 20 is less than a vertical distance between the second adjustment block 105 and the chip 20, warpage that is of the substrate 30 and that needs to be overcome by the second adjustment block 105 is more serious. Therefore, when the first adjustment block 104 and the second adjustment block 105 are disposed, a coefficient of expansion of the second adjustment block 105 is less than a coefficient of expansion of the first adjustment block 104, in other words, the second adjustment block 105 has larger stiffness, to ensure that the second adjustment block 105 can overcome larger warpage, thereby reducing warpage of the substrate 30. For example, the first adjustment block 104 uses a tungsten alloy (CTE=4), and the second adjustment block 105 uses an Invar alloy (CTE=2).

To facilitate understanding of the foregoing stiffener ring 10 provided as an example in this application, the stiffener ring 10 shown in FIG. 15 is used as an example for description. A composite stiffener ring 10 with Invar and W corners and a Cu body in which the stiffener ring body 102 uses a copper material, the first adjustment block 104 uses a tungsten alloy, and the second adjustment block 105 uses an Invar alloy is used as an example. For the stiffener ring 10 in FIG. 9, a stiffener ring 10 of a single material in the conventional technology, and a case in which no stiffener ring 10 is added to the surface mount assembly, warpage degrees of the substrate 30 at the room temperature (25 degrees Celsius) and the peak temperature (260 degrees Celsius) of reflow soldering are compared. A stiffener ring 10 of a 304 stainless steel material is used for comparison. Results are shown in Table 6.

TABLE 6

| Warpage value of a substrate 30 | 25° C. | 260° C. |
|---|---|---|
| Stiffener ring 10 of Cu | 242.5 μm | 145.8 μm |
| Composite stiffener ring 10 with Invar and W corners and a Cu body | 227.9 μm | 135.1 μm |

It can be learned from Table 6 that, when the stiffener ring 10 of single copper is used, because a CTE of the stiffener ring of single copper is greater than that of the substrate 30, a deformation of the substrate 30 is excessively corrected, and M-shaped and W-shaped deformations occur on the substrate 30 at the room temperature and the peak temperature of reflow soldering. Four corners are the lowest (highest) at the room temperature (high temperature). However, the FC-BGA packaging substrate 30 using a structure of a composite stiffener ring 10 with the Invar and W corners and the Cu body is better controlled at the normal temperature and the peak temperature of reflow soldering and is separately optimized by 6.0% and 7.3% compared with the stiffener ring 10 of single Cu.

As a variant, because warpage that is of the substrate 30 and that needs to be overcome by the first adjustment block 104 and the second adjustment block 105 is different, when the first adjustment block 104 and the second adjustment block 105 are disposed, a size of the second adjustment block 105 may be greater than a size of the first adjustment block 104, so that the second adjustment block 105 can overcome larger warpage.

As a variant, when diagonal warpage occurs on the substrate 30, one first adjustment block 104 and one second adjustment block 105 may be used, and the first adjustment block 104 and the second adjustment block 105 are diagonally disposed to overcome the warpage of the substrate 30.

It should be understood that, although FIG. 14 and FIG. 15 show an example in which the stiffener ring body 102 is made of one layer of material, the stiffener ring body 102 may be made of two layers of materials or three layers of materials. Details are not described herein again.

It can be learned from FIG. 9 to FIG. 15 that the stiffener ring 10 provided in embodiments of this application is made of two different materials to form the stiffener ring body 102 and the adjustment block (including but not limited to the adjustment block 103, the first adjustment block 104, and the second adjustment block 105). When the adjustment block is disposed, the adjustment block is disposed at a corner or the periphery of the stiffener ring body 102. Stiffness of the adjustment block is made greater than stiffness of the stiffener ring body 102, so that the adjustment block 102 has a relatively low coefficient of expansion, and therefore bridging at the corner of the substrate can be overcome. When the stiffener ring body 102 includes at least one material layer, the stiffness of the adjustment block is greater than stiffness of the material layer. For example, as shown in FIG. 9, FIG. 12, FIG. 13, and FIG. 14, when the stiffener ring body 102 includes one material layer, two material layers, and three material layers, the stiffness of the adjustment block is separately greater than stiffness of the one material layer, stiffness of the two material layers, and stiffness of the three material layers.

An embodiment of this application further provides a surface packaging assembly. The surface packaging assembly includes a laminated substrate and a chip. The substrate is electrically connected to the chip. The surface packaging assembly further includes the stiffener ring in any one of the foregoing descriptions. The stiffener ring is sleeved outside the chip, and the stiffener ring is laminated on and fastened to the substrate. Embodiments of this application provide a variety of stiffener rings, to better control a warpage deformation of a surface packaging assembly with temperature. The warpage deformation of the surface packaging assembly with temperature can be better controlled while a width and a height of the stiffener ring are not increased. In addition, a CTE matching the substrate is customized for the stiffener ring by using a layer thickness ratio design and selecting material types of a layered composite material. In addition, after the stiffener ring is attached to the substrate, the warpage deformation of the surface packaging assembly with temperature can be optimized.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A stiffener ring, configured to reduce warpage of a substrate of a surface packaging assembly, wherein the stiffener ring comprises a stiffener ring body that is annular and at least one adjustment block that is disposed at a same layer as the stiffener ring body and that is fastened to at least one corner of the stiffener ring body; and a coefficient of thermal expansion of the at least one adjustment block is less than a coefficient of thermal expansion of the stiffener ring body;

wherein the stiffener ring body comprises two material layers, and a lamination direction of the two material layers is perpendicular to a surface that is of the stiffener ring and that is configured for being attached to the substrate; and a warpage direction of thermal expansion of the stiffener ring body is opposite to a warpage direction of thermal expansion of the substrate.

2. The stiffener ring according to claim 1, wherein the stiffener ring body comprises a material layer made of one material; and
the coefficient of thermal expansion of the at least one adjustment block is less than a coefficient of thermal expansion of the material layer.

3. The stiffener ring according to claim 1, wherein when the stiffener ring is laminated on the substrate and a first material layer of the two material layers is closer to the substrate than a second material layer of the two material layers, and
a coefficient of thermal expansion of the first material layer is less than a coefficient of thermal expansion of the second material layer, or
the coefficient of thermal expansion of the first material layer is greater than the coefficient of thermal expansion of the second material layer.

4. The stiffener ring according to claim 1, wherein the stiffener ring body comprises three material layers, and two outer material layers of the three material layers are material layers of a same coefficient of thermal expansion, and a coefficient of thermal expansion of a middle material layer of the three material layers is different from the coefficient of thermal expansion of the two outer material layers.

5. The stiffener ring according to claim 1, wherein the stiffener ring body has a first side wall and a second side wall that are opposite to each other, and a distance between the first side wall and a chip is less than a distance between the second side wall and the chip;
the at least one adjustment block comprises a first adjustment block group and a second adjustment block group;
the first adjustment block group comprises one or more first adjustment blocks that are disposed in a one-to-one correspondence at one or more corners of the first side wall;
the second adjustment block group comprises one or more second adjustment blocks that are disposed in a one-to-one correspondence at one or more corners of the second side wall; and
a coefficient of expansion of the one or more second adjustment blocks is less than a coefficient of expansion of the one or more first adjustment blocks.

6. The stiffener ring according to claim 1, wherein stiffness of the at least one adjustment block is greater than stiffness of the stiffener ring body.

7. The stiffener ring according to claim 6, wherein the stiffener ring body comprises at least one material layer, and the stiffness of the at least one adjustment block is greater than stiffness of the material layer.

8. The stiffener ring according to claim 1, wherein the at least one adjustment block is welded or bonded to the stiffener ring body.

9. The stiffener ring according to claim 1, wherein a gap corresponding to each of the at least one adjustment block is disposed at the at least one corner of the stiffener ring body.

10. The stiffener ring according to claim 1, wherein the at least one adjustment block is of a triangular structure, a circular structure, or a fan-shaped structure.

11. The stiffener ring according to claim 1, wherein the stiffener ring is used in a chip in a flip chip ball grid array (FC-BGA) package.

12. A surface packaging assembly, comprising:
a chip;
a substrate that is laminated and that is electrically connected to the chip; and
a stiffener ring configured to reduce warpage of the substrate, and comprising a stiffener ring body that is annular and at least one adjustment block that is disposed at a same layer as the stiffener ring body and that is fastened to at least one corner of the stiffener ring body; and a coefficient of thermal expansion of the at least one adjustment block is less than a coefficient of thermal expansion of the stiffener ring body,
wherein the stiffener ring is sleeved outside the chip, and the stiffener ring is laminated on and fastened to the substrate;
wherein the stiffener ring body comprises two material layers, and a lamination direction of the two material layers is perpendicular to a surface that is of the stiffener ring and that is configured for being attached to the substrate; and
a warpage direction of thermal expansion of the stiffener ring body is opposite to a warpage direction of thermal expansion of the substrate.

13. The surface packaging assembly according to claim 12, wherein the stiffener ring body comprises a material layer made of one material; and
the coefficient of thermal expansion of the at least one adjustment block is less than a coefficient of thermal expansion of the material layer.

14. The surface packaging assembly according to claim 12, wherein when the stiffener ring is laminated on the substrate and a first material layer of the two material layers is closer to the substrate than a second material layer of the two material layers, and
a coefficient of thermal expansion of the first material layer is less than a coefficient of thermal expansion of the second material layer, or
the coefficient of thermal expansion of the first material layer is greater than the coefficient of thermal expansion of the second material layer.

15. The surface packaging assembly according to claim 12, wherein the stiffener ring body comprises three material layers, and two outer material layers of the three material layers are material layers of a same coefficient of thermal expansion, and a coefficient of thermal expansion of a middle material layer of the three material layers is different from the coefficient of thermal expansion of the outer material layers.

16. The surface packaging assembly according to claim 12, wherein the stiffener ring body has a first side wall and a second side wall that are opposite to each other, and a distance between the first side wall and a chip is less than a distance between the second side wall and the chip;
the at least one adjustment block comprises a first adjustment block group and a second adjustment block group;
the first adjustment block group comprises one or more first adjustment blocks that are disposed in a one-to-one correspondence at one or more corners of the first side wall;
the second adjustment block group comprises one or more second adjustment blocks that are disposed in a one-to-one correspondence at one or more corners of the second side wall; and
a coefficient of expansion of the one or more second adjustment blocks is less than a coefficient of expansion of the one or more first adjustment blocks.

17. The surface packaging assembly according to claim 12, wherein stiffness of the at least one adjustment block is greater than stiffness of the stiffener ring body.

18. The surface packaging assembly according to claim 17, wherein the stiffener ring body comprises at least one material layer, and the stiffness of the at least one adjustment block is greater than stiffness of the at least one material layer.

19. A stiffener ring, configured to reduce warpage of a substrate of a surface packaging assembly, wherein the stiffener ring comprises a stiffener ring body that is annular and at least one adjustment block that is disposed at a same layer as the stiffener ring body and that is fastened to at least one corner of the stiffener ring body; and a coefficient of thermal expansion of the at least one adjustment block is less than a coefficient of thermal expansion of the stiffener ring body;

wherein the stiffener ring body has a first side wall and a second side wall that are opposite to each other, and a distance between the first side wall and a chip is less than a distance between the second side wall and the chip;

the at least one adjustment block comprises a first adjustment block group and a second adjustment block group;

the first adjustment block group comprises one or more first adjustment blocks that are disposed in a one-to-one correspondence at one or more corners of the first side wall;

the second adjustment block group comprises one or more second adjustment blocks that are disposed in a one-to-one correspondence at one or more corners of the second side wall; and a coefficient of expansion of the one or more second adjustment blocks is less than a coefficient of expansion of the one or more first adjustment blocks.

* * * * *